United States Patent
Johnson

(10) Patent No.: US 7,203,122 B2
(45) Date of Patent: Apr. 10, 2007

(54) USER SELECTABLE BANKS FOR DRAM

(75) Inventor: Christopher S. Johnson, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 45 days.

(21) Appl. No.: 10/781,125

(22) Filed: Feb. 18, 2004

(65) Prior Publication Data

US 2004/0165468 A1   Aug. 26, 2004

Related U.S. Application Data

(63) Continuation of application No. 10/073,543, filed on Feb. 11, 2002, now Pat. No. 6,721,227.

(51) Int. Cl.
*G11C 8/00* (2006.01)
(52) U.S. Cl. ............... 365/230.03; 365/230.06; 365/230.01
(58) Field of Classification Search ........... 365/230.03, 365/230.02, 230.06, 189.12, 230.01
See application file for complete search history.

(56) References Cited

U.S. PATENT DOCUMENTS

| | | | |
|---|---|---|---|
| 4,757,440 A | 7/1988 | Scheuneman | |
| 5,812,491 A | 9/1998 | Shinozaki et al. | |
| 5,896,404 A * | 4/1999 | Kellogg et al. | 714/763 |
| 5,912,860 A | 6/1999 | Schaefer | |
| 5,973,988 A | 10/1999 | Nakahira et al. | |
| 5,978,297 A * | 11/1999 | Ingalls | 365/225.7 |
| 6,026,465 A | 2/2000 | Mills et al. | |
| 6,044,032 A | 3/2000 | Li | |
| 6,055,615 A | 4/2000 | Okajima | |
| 6,084,818 A * | 7/2000 | Ooishi | 365/230.03 |
| 6,104,668 A | 8/2000 | Lee et al. | |
| 6,111,814 A | 8/2000 | Schaefer | |
| 6,278,648 B1 | 8/2001 | Cowles et al. | |
| 6,289,413 B1 | 9/2001 | Rogers et al. | |
| 6,304,510 B1 * | 10/2001 | Nobunaga et al. | 365/230.06 |
| 6,366,524 B1 | 4/2002 | Abedifard | |
| 6,418,066 B1 * | 7/2002 | Hidaka | 365/198 |
| 6,496,444 B2 * | 12/2002 | Roohparvar | 365/233 |
| 6,549,468 B2 * | 4/2003 | Zitlaw et al. | 365/185.33 |
| 2001/0043502 A1 * | 11/2001 | Ooishi | 365/230.03 |
| 2002/0110041 A1 * | 8/2002 | Kono | 365/230.08 |

* cited by examiner

*Primary Examiner*—Thong Q. Le
(74) *Attorney, Agent, or Firm*—Leffert Jay & Polglaze

(57) ABSTRACT

A memory device includes a configurable array of memory cells. A number of array banks is configured based upon data stored in a mode register or decoded by logic circuitry. The memory device remains a full capacity memory, regardless of the number of array banks. Memory address decoding circuitry is adjusted to route address signals to or from a bank address decoder based upon the number of array banks selected.

35 Claims, 2 Drawing Sheets

USER SELECTABLE BANKS FOR DRAM

CROSS-REFERENCE TO RELATED APPLICATION

This is a continuation application of application Ser. No. 10/073,543, titled USER SELECTABLE BANKS FOR DRAM, filed Feb. 11, 2002 (now U.S. Pat. No. 6,721,227 allowed), which application is assigned to the assignee of the present invention and the entire contents of which are incorporated herein by reference.

FIELD OF THE INVENTION

The present invention relates generally to memory devices and in particular the present invention relates to memory bank addressing.

BACKGROUND OF THE INVENTION

Memory devices such as dynamic random access memories (DRAM) include memory cell arrays to store data. The memory array is typically arranged in addressable rows and columns. Often, the array is also arranged in numerous addressable banks. These banks can be physically separated on the memory die and have separate access circuitry. As such, row, column and bank addresses are used to read and write to the memory.

The number of memory array banks provided in a memory device can limit data access speed of the memory. That is, a memory device that has two banks allows the second bank to begin access operations while the first array is accessed. Likewise, additional array banks increase the likelihood that requested data is stored in different banks. Because repeated assesses to the same bank fail to take advantage of the parallel bank access functionality, an increased number of banks is advantageous.

Memory device manufactures attempt to make new generations of memory devices compatible with prior memory device generations. This compatibility allows one device to be manufactured without making the prior generation obsolete. If the new generation is not compatible, two or more generations are required to support current systems and future systems. Reverse compatible memory devices having a different number of array banks has proven difficult. For example, a new memory design with eight banks has different addressing and physical layout than a four-bank memory device. As such, both four and eight bank memory devices must be manufactured.

Memory manufactures have provided options that can change the capacity of a memory to reduce power consumption. For example, the memory array and addressing can be modified to reduce storage capacity. By reducing the memory size, portions of the array can be eliminated from refresh operations. While this option reduces power consumption, it does not provide a viable option to configure a memory without reducing the memory capacity.

For the reasons stated above, and for other reasons stated below which will become apparent to those skilled in the art upon reading and understanding the present specification, there is a need in the art for a memory device that can be configure with variable sized array banks.

SUMMARY OF THE INVENTION

The above-mentioned problems with memory devices and other problems are addressed by the present invention and will be understood by reading and studying the following specification.

In one embodiment, a memory device comprises an array of memory cells arranged in a plurality of addressable banks, each bank comprises addressable rows and columns of memory cells, a mode register, and address circuitry coupled to the mode register to configure the addressable banks in response to a program state of the mode register.

In another embodiment, a dynamic random access memory comprises an array of X memory cells, a mode register, and address circuitry coupled to the mode register to configure the array in response to a program state of the mode register. The mode register defines a number of addressable banks of the array.

A synchronous dynamic random access memory (SDRAM) comprises an array of X memory cells, a mode register, a column address decoder, a row address decoder, and a bank address decoder. Address signal circuitry is coupled to a plurality of address signal input connections and routes a selected one of the plurality of address input connections to either the row or bank address decoder in response to data stored in the mode register.

A method of operating a memory device comprises programming a mode register of the memory device, and adjusting address circuitry of the memory device in response to the programmed mode register. The address circuitry configures a number of addressable banks of a memory cell array.

DETAILED DESCRIPTION OF THE DRAWINGS

In the following detailed description of the preferred embodiments, reference is made to the accompanying drawings, which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

The present invention provides a memory device that can operate with a full density while changing addressing schemes. As stated above, an increased number of banks in a memory device can result in more efficient accessing of the memory array. The present invention allows a memory device to be configured to increase or decrease the number of memory array banks without changing the density of the memory. This allows the memory device to be both forward and backward compatible.

Figure 1:
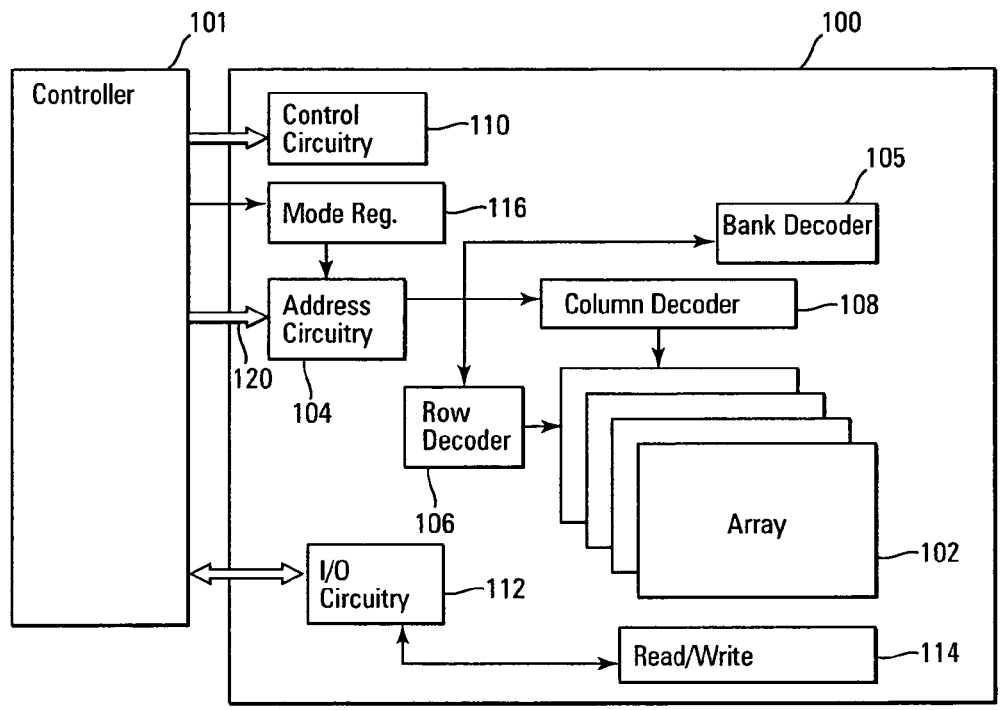
FIG. 1 is a block diagram of a memory device according to one embodiment of the present invention.

Referring to FIG. 1, a block diagram of a memory device 100 according to one embodiment of the present invention is described. The memory device includes an array of memory cells 102 that is arranged in a plurality of physical banks. It will be appreciated that the layout of the array is dependant upon the design of the memory device and the present invention is not limited to any one type of physical layout.

Address circuitry 104 is provided to access the memory cells in combination with bank 105, row 106 and column 108 decoders. A control circuit 110 is provided to perform read and write operations in response to externally provided control signals from controller 101. Bi-directional data communication with the memory array is performed by I/O circuitry 112 and read/write circuitry 114. A mode register 116 is provided to define operating modes for the memory device. The mode register is typically used to define clock latency, burst access type and burst access lengths. The mode register of the present invention is used to set the address circuitry to configure the memory device for different bank addressing. Address input connections 120 include one or more address connections that can be used as either a row or column address, or a bank address.

It will be appreciated by those skilled in the art, with the benefit of the present description, that the memory device has been simplified and that additional circuitry and features may be required. In one embodiment, the memory device is a synchronous DRAM. In yet another embodiment the memory is a DDR SDRAM. The present invention, however, is not limited to a dynamic memory, but can be any memory device having address input connections, such as SDRAM, RDRAM, Flash, DRAM, SRAM, SGRAM and the other semiconductor memories.

Figure 2:
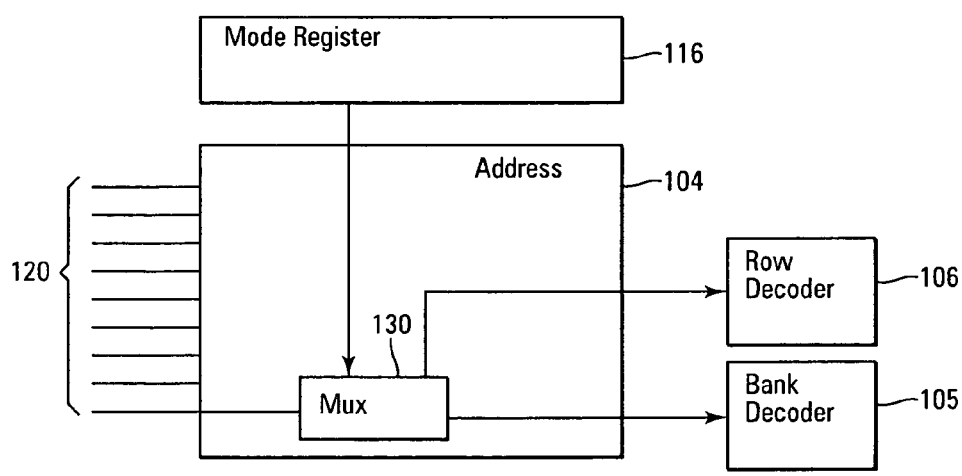
FIG. 2 is a block diagram of addressing circuitry of FIG. 1.

Referring to FIG. 2, a block diagram of the addressing circuitry 104 of FIG. 1 is further described. The mode register 116 is coupled to the address circuit to change the decoding of one or more input address signals. That is, the address signal inputs 120 provided to the memory device include bank, row and column addresses. In a four-bank memory addressing scheme less bank addresses are required than in an eight-bank memory addressing scheme. As such, one or more of the address connections have a dual purpose. When the mode register is programmed to operate as an eight-bank memory, an address input is routed through an address multiplexer circuit 130 to the bank decoding circuit. When the mode register is programmed to operate as a four-bank memory, the address input is routed through the address multiplexer circuit to the row decoding circuit 106. Thus, the memory device can be programmed to operate as either a four-bank memory with X rows per bank, or an eight-bank memory with Y rows per bank without changing the memory capacity. Again, the present invention is not limited to four or eight banks, but can be any combination of banks, rows and columns.

Figure 3:
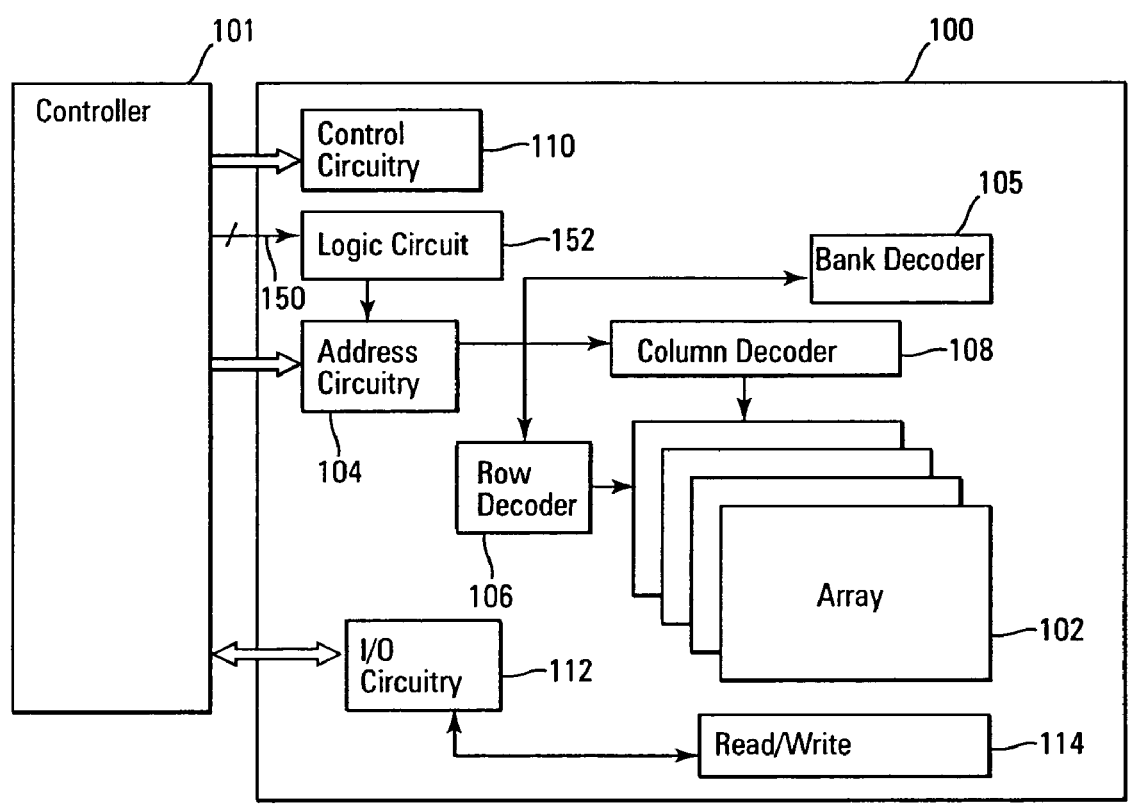
FIG. 3 is a block diagram of a memory device according to another embodiment of the present invention.

In an alternate embodiment, the mode register can be replaced with an external signal input and a decode circuit. Referring to FIG. 3, an external signal is provided on input 150. In one embodiment, this input signal is a one-bit binary configuration signal that is decoded by logic circuit 152. In embodiments where the array can be configured in to multiple different sizes, the input signal may be a multi-bit configuration signal. The logic circuit 152 operates in substantially the same manner as the mode register, as described above. That is, the logic circuitry is used to control the address circuitry to change the number and size of the array blocks.

CONCLUSION

A memory device has been described that includes a configurable array of memory cells. A number of array banks is configured based upon data stored in a mode register. The memory device remains a full capacity memory, regardless of the number of array banks. Memory address decoding circuitry is adjusted to route address signals to or from a bank address decoder based upon the number of array banks selected.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

The invention claimed is:

1. A system, comprising:
   a controller; and
   a memory device coupled to the controller to receive signals therefrom, and comprising:
   an array of memory cells arranged in a plurality of addressable banks, each bank comprises addressable rows and columns of memory cells;
   a mode register; and
   address circuitry coupled to the mode register to configure the addressable banks in response to a program state of the mode register, wherein the address circuitry selectively routes address signal to either a row decoder or a bank decoder in response to the mode register.

2. A system, comprising:
   a controller; and
   a dynamic random access memory device coupled to the controller and comprising:
   an array of X memory cells;
   a mode register; and
   address circuitry coupled to the mode register to configure the array in response to a program state of the mode register, wherein the mode register defines a number of addressable banks of the array, wherein the address circuitry comprises column, row and bank address decoders.

3. The system of claim 2 wherein the address circuitry routes a selected address input signal to either the row or bank decoder in response to the mode register.

4. The system of claim 3 wherein the address circuitry comprises a multiplex circuit.

5. A system, comprising:
   a controller; and
   a synchronous dynamic random access memory (SDRAM) coupled to the controller and comprising:
   an array of X memory cells;
   a mode register;
   a column address decoder;
   a row address decoder;
   a bank address decoder; and
   address signal circuitry coupled to a plurality of address signal input connections, the address signal circuitry routes a selected one of the plurality of address input connections to either the row or bank address decoder in response to data stored in the mode register.

6. The system of claim 5 wherein a first state of the mode register configures the array into Y banks each having X/Y memory cells, and a second state of the mode register configures the array into Z banks each having X/Z memory cells.

7. The system of claim 6 wherein X=4 and Z=8.

8. A system, comprising:
a controller; and
a synchronous dynamic random access memory (SDRAM) coupled to the controller and comprising:
an array of X memory cells;
at least one external input connection to receive a configuration signal;
logic circuitry coupled to the at least one external input connection;
a column address decoder;
a row address decoder;
a bank address decoder; and
address signal circuitry coupled to a plurality of address signal input connections, the address signal circuitry routes a selected one of the plurality of address input connections to either the row or bank address decoder in response to the logic circuitry.

9. The system of claim 8 wherein a first state of the logic circuitry configures the array into Y banks each having X/Y memory cells, and a second state of the logic circuitry configures the array into Z banks each having X/Z memory cells.

10. The system of claim 9 wherein X=4 and Z=8.

11. The system of claim 8 wherein the at least one external input connection comprises two input connections to receive a two-bit configuration signal.

12. A system, comprising:
a controller; and
a memory device coupled to the controller to receive signals including an input signal therefrom, and comprising:
an array of memory cells arranged in a plurality of addressable banks, each bank comprises addressable rows and columns of memory cells;
a decode circuit to decode the input signal; and
address circuitry coupled to the decode circuit to configure the addressable banks in response to a program state of the input signal.

13. The system of claim 12 wherein the addressable banks can be configured as either four or eight banks.

14. The system of claim 12 wherein the address circuitry selectively routes address signal to either a row decoder or a bank decoder in response to the input signal.

15. The system of claim 12, wherein the input signal is a one-bit binary input.

16. The system of claim 12, wherein the input signal is a multi-bit binary input and the number of banks is configurable.

17. The system of claim 16, wherein the number of banks is four or eight.

18. A system, comprising:
a controller providing an input signal; and
a dynamic random access memory device coupled to the controller and comprising:
an array of X memory cells;
a decode circuit to decode the input signal; and
address circuitry coupled to the decode circuit to configure the array in response to a program state of the input signal, wherein the input signal defines a number of addressable banks of the array, wherein a first state of the input signal configures the array into Y banks each having X/Y memory cells, and a second state of the input signal configures the array into Z banks each having X/Z memory cells.

19. A system, comprising:
a controller providing an input signal; and
a dynamic random access memory device coupled to the controller and comprising:
an array of X memory cells;
a decode circuit to decode the input signal; and
address circuitry coupled to the decode circuit to configure the array in response to a program state of the input signal, wherein the input signal defines a number of addressable banks of the array, wherein the address circuitry comprises column, row and bank address decoders.

20. The system of claim 19 wherein the address circuitry routes a selected address input signal to either the row or bank decoder in response to the controller input signal.

21. The system of claim 19 wherein the address circuitry comprises a multiplex circuit.

22. A memory device comprising:
an array of memory cells arranged in a plurality of addressable banks, each bank comprises addressable rows and columns of memory cells;
a decode circuit to decode an external input signal; and
address circuitry coupled to the decode circuit to configure the addressable banks in response to a program state of the external input signal, wherein the address circuitry selectively routes address signal to either a row decoder or a bank decoder in response to the external input signal.

23. A dynamic random access memory comprising:
an array of X memory cells;
a decode circuit to decode an external input signal; and
address circuitry coupled to the decode circuit to configure the array in response to a program state of the external input signal, wherein the input signal defines a number of addressable banks of the array, wherein a first state of the input signal configures the array into Y banks each having X/Y memory cells, and a second state of the mode register configures the array into Z banks each having X/Z memory cells.

24. A dynamic random access memory comprising:
an array of X memory cells;
a decode circuit to decode an external input signal; and
address circuitry coupled to the decode circuit to configure the array in response to a program state of the external input signal, wherein the input signal defines a number of addressable banks of the array, wherein the address circuitry comprises column, row and bank address decoders.

25. The dynamic random access memory of claim 24 wherein the address circuitry routes a selected address input signal to either the row or bank decoder in response to the external input signal.

26. The dynamic random access memory of claim 25 wherein the address circuitry comprises a multiplex circuit.

27. A synchronous dynamic random access memory (SDRAM) comprising:
an array of X memory cells;
a decode circuit to decode an external input signal;
a column address decoder;
a row address decoder;
a bank address decoder; and
address signal circuitry coupled to a plurality of address signal input connections, the address signal circuitry routes a selected one of the plurality of address input connections to either the row or bank address decoder in response to data decoded by the decode circuit.

28. The SDRAM of claim 27 wherein a first state of the external input signal configures the array into Y banks each having X/Y memory cells, and a second state of the external input signal configures the array into Z banks each having X/Z memory cells.

29. The SDRAM of claim 28 wherein X=4 and Z=8.

30. A method of operating a memory device comprising:
receiving an external input signal at decode circuitry of the memory device; and
adjusting address circuitry of the memory device in response to the decoded external input signal, wherein the address circuitry configures a number of addressable banks of a memory cell array, wherein the address circuitry routes an externally provided address signal to either a bank address decoder or a row address decoder.

31. A method of operating a memory device comprising:
receiving an external input signal at decode circuitry of the memory device; and
adjusting address circuitry of the memory device in response to the decoded external input signal, wherein the address circuitry configures a number of addressable banks of a memory cell array, wherein the memory device comprises X rows, Y columns and Z banks, where the array comprises X*Y*Z memory cells.

32. The method of claim 31 where the Z banks are configurable to 2, 4, 8 or 16 banks.

33. A method of operating a memory system comprising:
outputting decode circuitry data from a processor to a memory device, wherein the decode circuitry decodes an external input signal to generate bank count data; and
adjusting address circuitry of the memory device in response to the decoded external input signal, wherein the address circuitry configures a number of addressable banks of a memory cell array using the bank count data.

34. The method of claim 33 wherein the external input signal data comprises one bit of data.

35. The method of claim 33 wherein the address circuitry routes externally address signals provided by the processor to either a bank address decoder or a row address decoder of the memory device.

* * * * *